(12) United States Patent
Jiang et al.

(10) Patent No.: US 12,317,541 B2
(45) Date of Patent: May 27, 2025

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Yu-Wei Jiang, Hsinchu (TW); Sheng-Chih Lai, Hsinchu County (TW); Feng-Cheng Yang, Hsinchu County (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 569 days.

(21) Appl. No.: 17/583,243

(22) Filed: Jan. 25, 2022

(65) Prior Publication Data

US 2023/0136514 A1    May 4, 2023

Related U.S. Application Data

(60) Provisional application No. 63/275,929, filed on Nov. 4, 2021.

(51) Int. Cl.
*H10D 30/67* (2025.01)
*H10D 30/01* (2025.01)

(52) U.S. Cl.
CPC ....... *H10D 30/6735* (2025.01); *H10D 30/031* (2025.01); *H10D 30/6713* (2025.01); *H10D 30/6755* (2025.01); *H10D 30/6757* (2025.01)

(58) Field of Classification Search
CPC ........ H01L 29/78669; H01L 29/78678; H10D 30/031; H10D 30/6713; H10D 30/6755; H10D 30/6757
See application file for complete search history.

(56) References Cited

U.S. PATENT DOCUMENTS

| | | | | |
|---|---|---|---|---|
| 12,062,723 B2* | 8/2024 | Takahashi | ......... | H01L 29/66969 |
| 2004/0247929 A1* | 12/2004 | Buhay | ...................... | G02B 1/10 |
| | | | | 428/632 |
| 2007/0020841 A1* | 1/2007 | Hwang | .................. | B82Y 10/00 |
| | | | | 257/E27.103 |
| 2018/0244513 A1* | 8/2018 | Kub | ........................ | B81B 3/0072 |
| 2020/0395426 A1* | 12/2020 | Han | ....................... | H10K 59/126 |

FOREIGN PATENT DOCUMENTS

JP    2018160643    * 10/2018

* cited by examiner

*Primary Examiner* — Matthew L Reames
(74) *Attorney, Agent, or Firm* — JCIPRNET

(57) ABSTRACT

A semiconductor device and a manufacturing method thereof are provided. The semiconductor device includes a gate, a semiconductor channel layer, a gate dielectric layer, a source terminal and a drain terminal. The semiconductor channel layer is disposed over and above the gate. The gate dielectric layer is disposed between the gate and the semiconductor channel layer. The source terminal and the drain terminal are disposed on the semiconductor channel layer. A contact plug is disposed on at least one of the source terminal and the drain terminal. A dielectric pattern surrounds the contact plug and covers the source terminal and the drain terminal. A gas barrier layer is disposed on the dielectric pattern and surrounding the contact plug.

20 Claims, 9 Drawing Sheets

SEMICONDUCTOR DEVICE AND MANUFACTURING METHOD THEREOF

CROSS-REFERENCE TO RELATED APPLICATION

This application claims the priority benefit of U.S. provisional application Ser. No. 63/275,929, filed on Nov. 4, 2021. The entirety of the above-mentioned patent application is hereby incorporated by reference herein and made a part of this specification.

BACKGROUND

Following the developments in semiconductor manufacturing technologies, the size of the integrated circuit keeps decreasing and more and more semiconductor devices and electronic components are integrated together, leading to high integration density.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
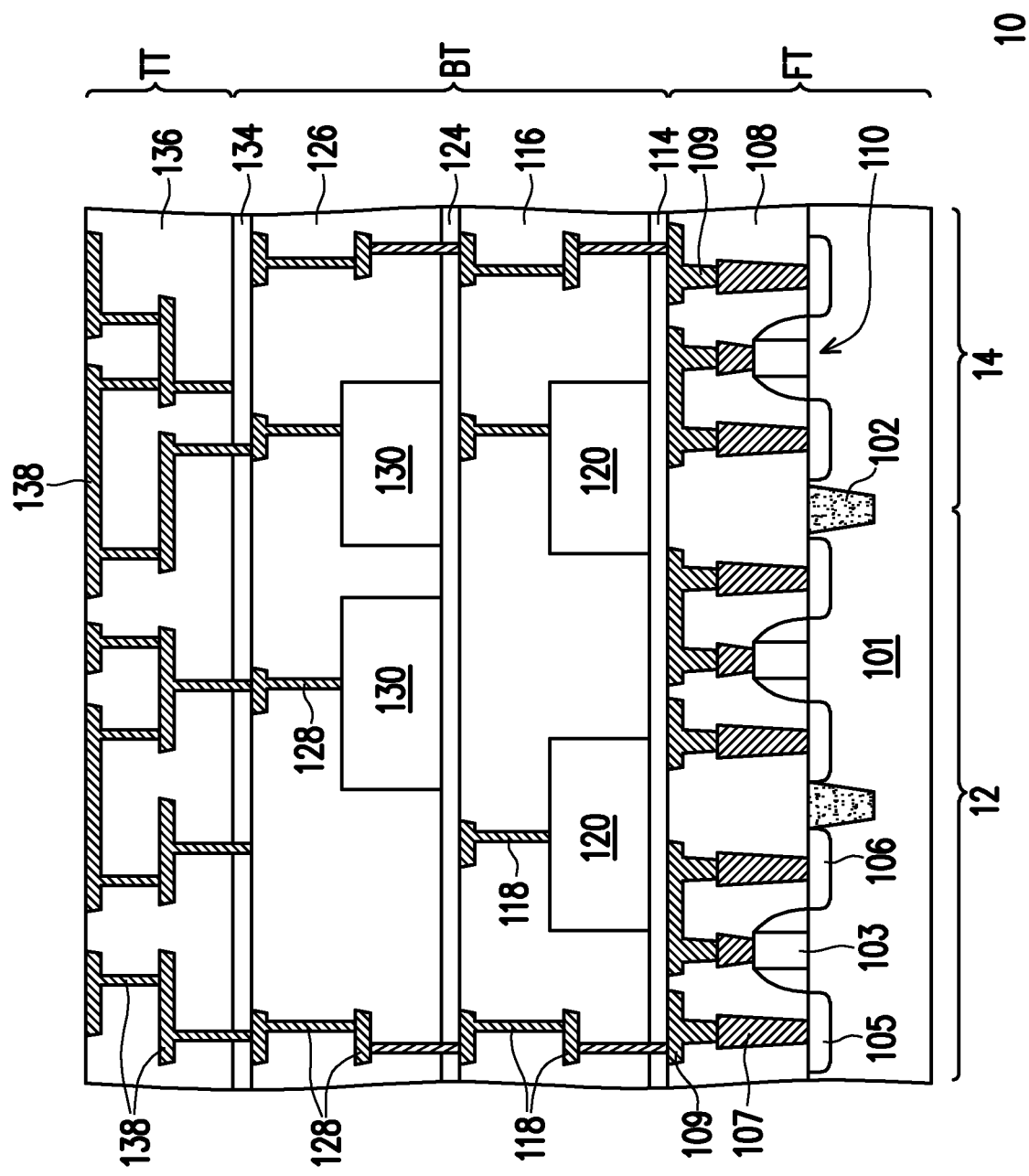
FIG. 1 illustrates a cross-sectional view of an integrated structure with semiconductor devices according to some embodiments of the present disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

It should be appreciated that the following embodiment(s) of the present disclosure provides applicable concepts that can be embodied in a wide variety of specific contexts. The specific embodiment(s) discussed herein is merely illustrative and is related to an integration structure containing more than one type of semiconductor devices, and is not intended to limit the scope of the present disclosure. Embodiments of the present disclosure describe the exemplary manufacturing process of integration structures formed with one or more semiconductor devices such as transistors and the integration structures fabricated there-from. Certain embodiments of the present disclosure are related to the structures including semiconductor transistors and/or other semiconductor devices and electronic components. The substrates and/or wafers may include one or more types of integrated circuits or electronic components therein. The semiconductor device(s) may be formed on a bulk semiconductor substrate or a silicon/germanium-on-insulator substrate. The embodiments are intended to provide further explanations but are not used to limit the scope of the present disclosure.

FIG. 1 illustrates a cross-sectional view of an integrated structure with semiconductor devices according to some embodiments of the present disclosure.

As seen in FIG. 1, in some embodiments, the integrated structure 10 includes a frontend tier FT with more than one semiconductor devices 110 formed therein and backend tiers BT formed on the frontend tier FT and formed with semiconductor devices 120 and 130. In some embodiments, the semiconductor devices 110 in the frontend tier FT are formed through the front-end-of-line (FEOL) manufacturing processes. In some embodiments, the backend tiers BT and the semiconductor devices 120 and 130 are formed through the back-end-of-line (BEOL) manufacturing processes.

As illustrated in FIG. 1, the integrated structure 10 includes different regions for forming different types of circuits. For example, integrated structure 10 may include a first region 12 for forming logic circuits, and a second region 14 for forming, e.g., peripheral circuits, input/output (I/O) circuits, electrostatic discharge (ESD) circuits, and/or analog circuits. Other regions for forming other types of circuits are possible and are fully intended to be included within the scope of the present disclosure. In some embodiments, the frontend tier FT includes a substrate 101 and the semiconductor devices 110 are formed on/in the substrate 101. In some embodiments, the substrate 101 may be a bulk substrate, such as a silicon substrate, doped or undoped, or an active layer of a semiconductor-on-insulator (SOI) substrate. In some embodiments, the substrate 101 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. For example, additional electrical components, such as resistors, capacitors, inductors, diodes, or the like, may be formed in or on the substrate 101 during the FEOL manufacturing processes.

As seen in FIG. 1, in some embodiments, the semiconductor devices 110 includes field effect transistor (FET) devices such as metal-oxide-semiconductor (MOS) FETs. Herein, the planar transistors are shown as an example, but it is understood that other kinds of FEOL devices such fin-type field effect transistors (FinFETs), or gate-all-around (GAA) transistors may be used herein and included within the scope of the present disclosure. In one embodiment, the semiconductor devices 110 are formed on the substrate 101, and isolation regions 102, such as shallow trench isolation (STI) regions, are formed between or around the semiconductor devices 110. In some embodiments, the semiconductor device 110 includes a gate structure 103 formed on the substrate 101, and source/drain regions 105/106, such as doped and/or epitaxial source/drain regions, are formed on opposing sides of the gate structure 103. In some embodiments, conductive contacts 107, such as gate contacts and source/drain contacts, are formed over and electrically coupled to respective underlying electrically conductive features (e.g., gate electrodes or source/drain regions). In some embodiments, a dielectric layer 108, such as an inter-layer dielectric (ILD) layer, is formed over the substrate 101 covering the source/drain regions 105/106, the gate structures 103 and the conductive contacts 107, and other electrically conductive features such as metallic interconnect structures 109 are embedded in the dielectric layer 108. It is understood that the dielectric layer 108 may include more than one dielectric sublayers of the same or different dielectric materials. Collectively, the substrate 101, the devices 110, the contacts 107, the conductive features such as metallic interconnect structures 109, and the dielectric layers 108 shown in FIG. 1 may be referred to as the frontend tier FT. It is noted that the frontend tier FT formed through the FEOL processes may be referred to as a substrate in some embodiments of this disclosure.

Referring to FIG. 1, following the formation of the frontend tier FT, backend tiers BT are formed by sequentially forming dielectric layers 114, 116, 124, 126, 134 over the dielectric layer 108. In one embodiment, the dielectric layers 114, 124, 134 may include one or more etch stop layers. In some embodiments, the materials of the dielectric layers 114, 124, 134 are different from the materials of the dielectric layers 116, 126. In some embodiments, the material of the dielectric layer 114 or 124 includes silicon nitride, silicon oxynitride, silicon oxycarbide or silicon carbide formed by chemical vapor deposition (CVD). In one embodiment, at least one of the dielectric layers 114, 116, 124 and 126 further includes a barrier layer such as a gas barrier layer, and details will be described later. In one embodiment, at least one of the dielectric layers 114, 116, 124 and 126 further includes a gas absorbing layer, and details will be described later. In some embodiments, the material of the dielectric layer 134 includes silicon nitride, silicon oxynitride or silicon carbide formed by CVD. In some embodiments, one or more of the dielectric layers 114, 124, 134 may be omitted. In some embodiments, the dielectric layers 116, 126 may be formed of any suitable dielectric material, such as silicon oxide, silicon nitride, silicon oxynitride, fluorosilicate glass (FSG), phosphosilicate glass (PSG), borosilicate glass (BSG), boron-doped phosphosilicate glass (BPSG), or low-k materials, formed by a suitable method, such as spin coating, CVD, physical vapor deposition (PVD), or the like. Referring to FIG. 1, in some embodiments, the backend tiers BT include metallization structures 118 and 128 respectively embedded in the dielectric layers 116 and 126. In some embodiments, the metallization structures 118, 128 may include metallic lines, vias and contact plugs. In certain embodiments, the materials of the metallization structures 118, 128 include aluminum (Al), copper (Cu), cobalt (Co), titanium (Ti), tantalum (Ta), tungsten (W), alloys thereof or combinations thereof.

In FIG. 1, the semiconductor devices 120 and 130 are respectively formed in the dielectric layers 116 and 126, and some or all of the semiconductor devices 120 and 130 are electrically coupled to each other and/or electrically coupled to the underlying semiconductor devices 110 in the frontend tier FT. In exemplary embodiments, the semiconductor devices 120 and 130 are electrically connected with the metallization structures 118 and 128, and some of the devices located in the frontend tier FT and the backend tiers BT are further electrically interconnected with one another through the metallic interconnect structures 109 and the metallization structures 118, 128. The metallization structures shown herein are merely for illustrative purposes, and the metallization structures may include other configurations and may include one or more through vias and/or damascene structures.

In FIG. 1, in some embodiments, the semiconductor devices 120 and 130 are formed at different layers of the backend tiers BT. In some embodiments, the semiconductor devices 120 and 130 have the same or similar structure or perform the same or similar function. In some embodiments, the semiconductor devices 120 and 130 have different structure designs or perform different functions. In some embodiment, the semiconductor device 120 or 130 may be integrated with or in any suitable semiconductor devices or fabricated as part of a three-dimensional (3D) ferroelectric random access memory (FeRAM) devices or part of a 3D memory array.

Although the backend tiers BT are shown to have two layers and semiconductor devices are formed in the two layers in the backend tiers BT as seen in FIG. 1, other numbers of layers may be included in the backend tiers BT and the semiconductor devices may be formed in, such as one layer, three layers, or more layers, and these variations are also possible and are encompassed within the scope of the present disclosure. Collectively, the layers formed with the semiconductor devices 120 and 130 in the backend tiers BT are referred to as the device layer or a device region of the integrated structure 10. In some embodiments, the semiconductor devices 120 and 130 are formed during the BEOL processes of semiconductor manufacturing, and the semiconductor devices 120 and 130 may be formed at any suitable locations within the integrated structure 10, such as over the first region 12, over the second region 14, or over a plurality of regions.

Still referring to FIG. 1, after the backend tiers BT are formed, a top interconnect tier TT is formed over the dielectric layer 134. In some embodiments, the interconnect tier TT includes electrically conductive interconnect structures 138 such metallic wiring patterns and metallic vias embedded in the dielectric layer(s) 136. The dielectric layer 136 may be formed of similar materials and through similar forming methods as described for the dielectric layers 116, 126, and the interconnect structures 138 may be formed from similar materials as described for the metallization structures 118, 128 using any suitable methods, but the details are not repeated. In some embodiments, the interconnect tier TT may electrically connect the devices 120, 130 in the backend tiers BT with the devices 110 and/or the components in the frontend tier FT to form functional circuits. In addition, the devices 120 and 130 may be electrically coupled to an external circuit or an external device through the structure of the interconnect tier TT.

Figure 7:
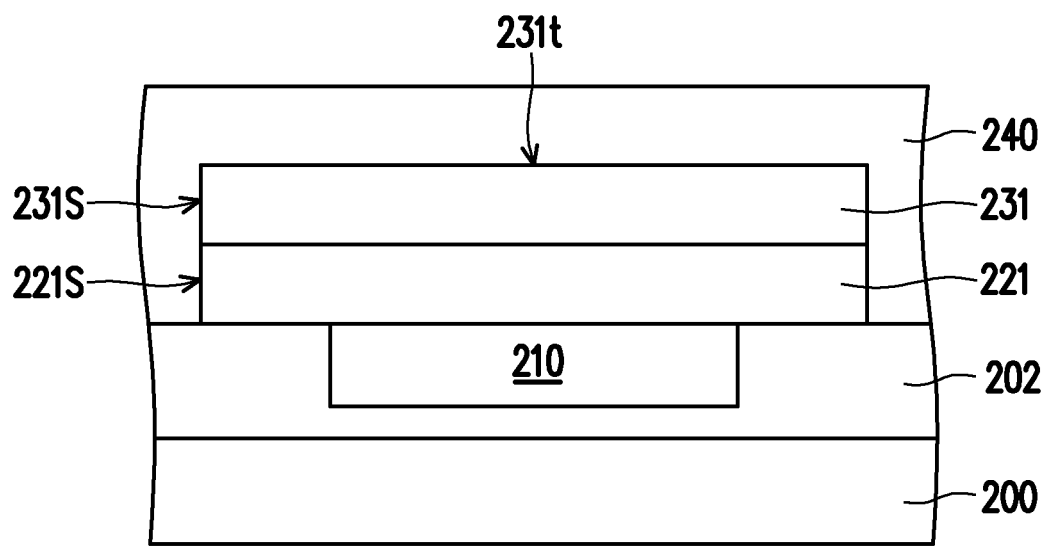
Figure 8:
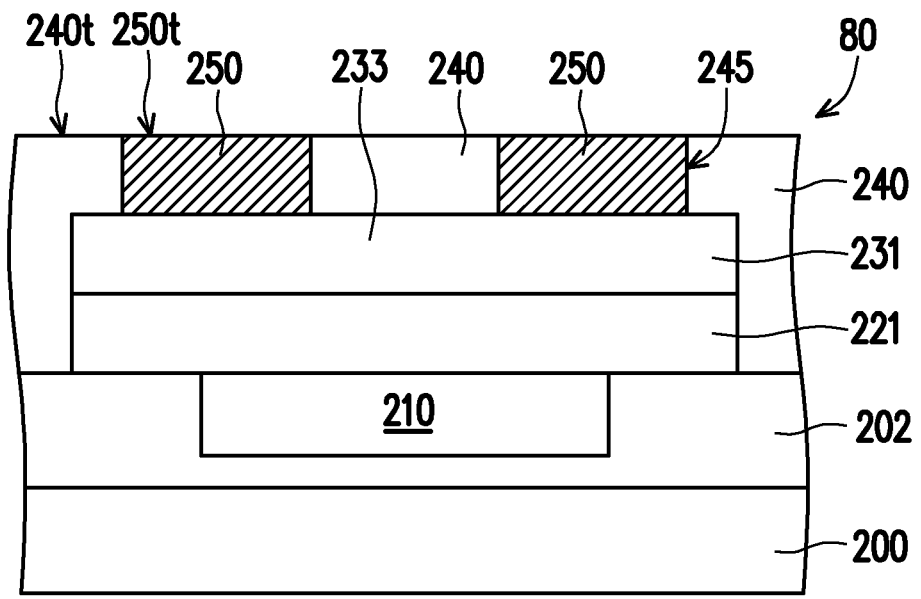
Figure 9:
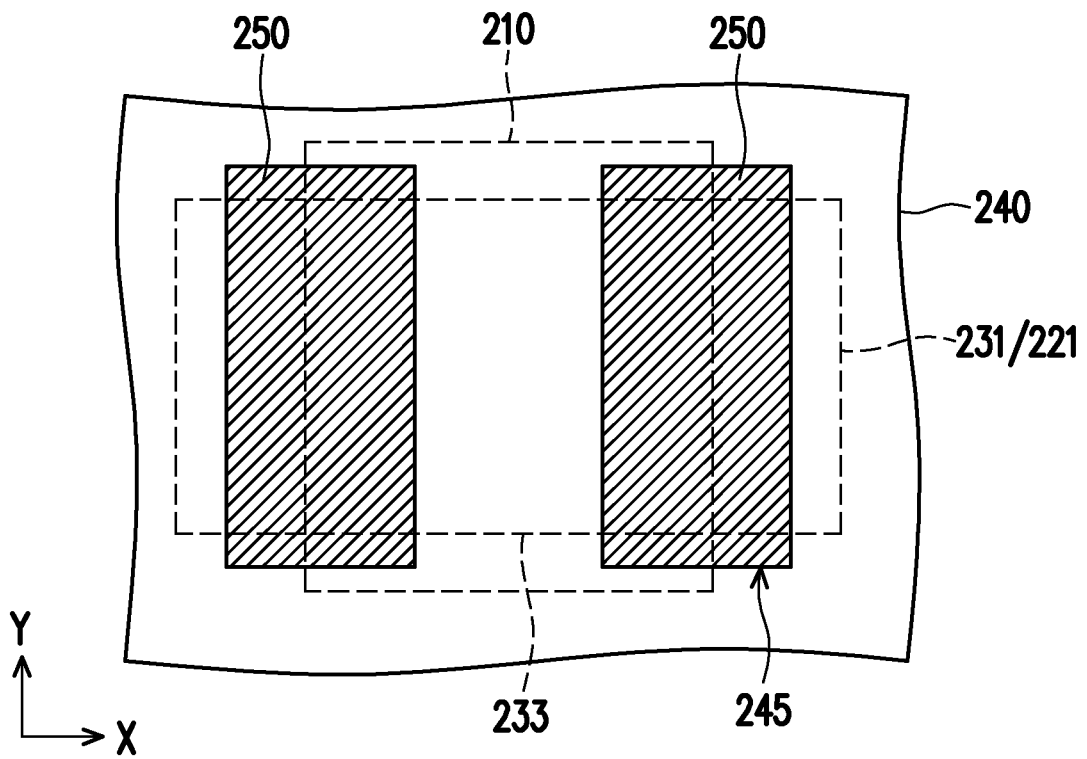
Figure 10:
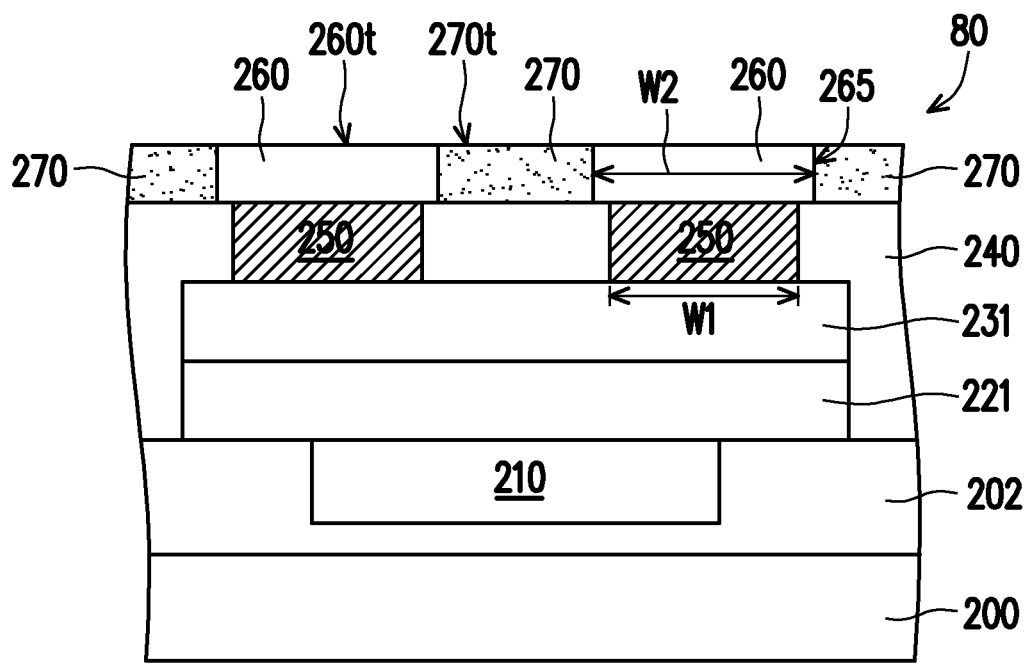
Figure 11:
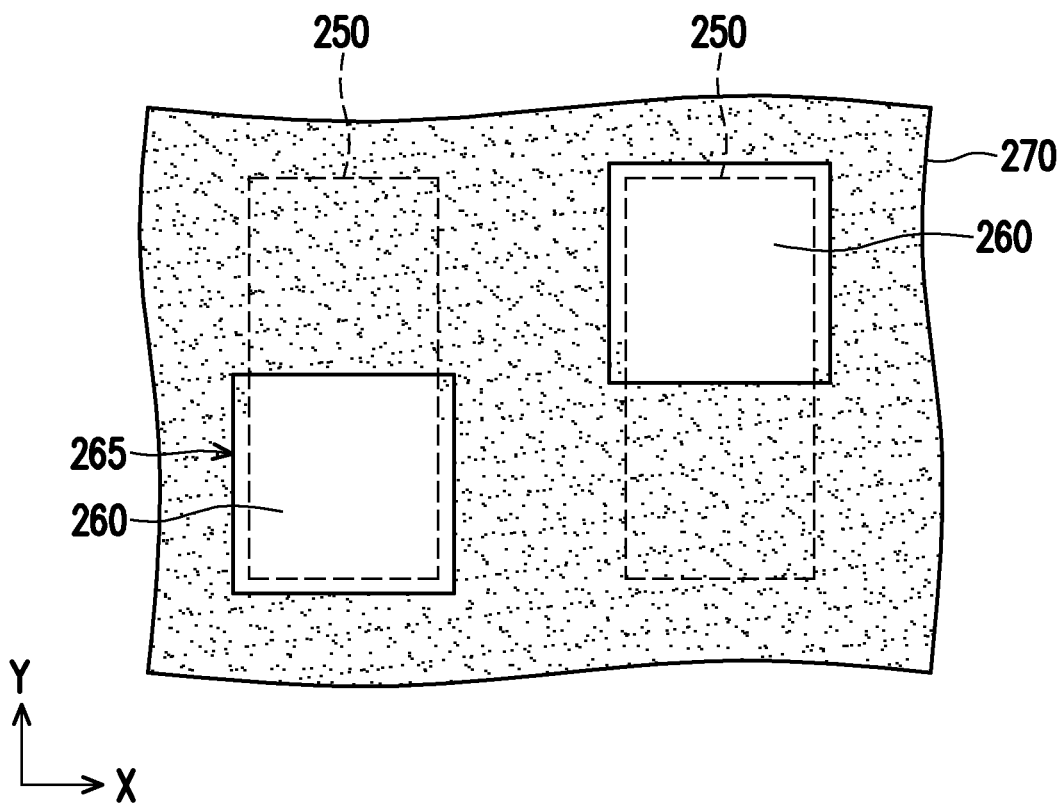
Figure 12:
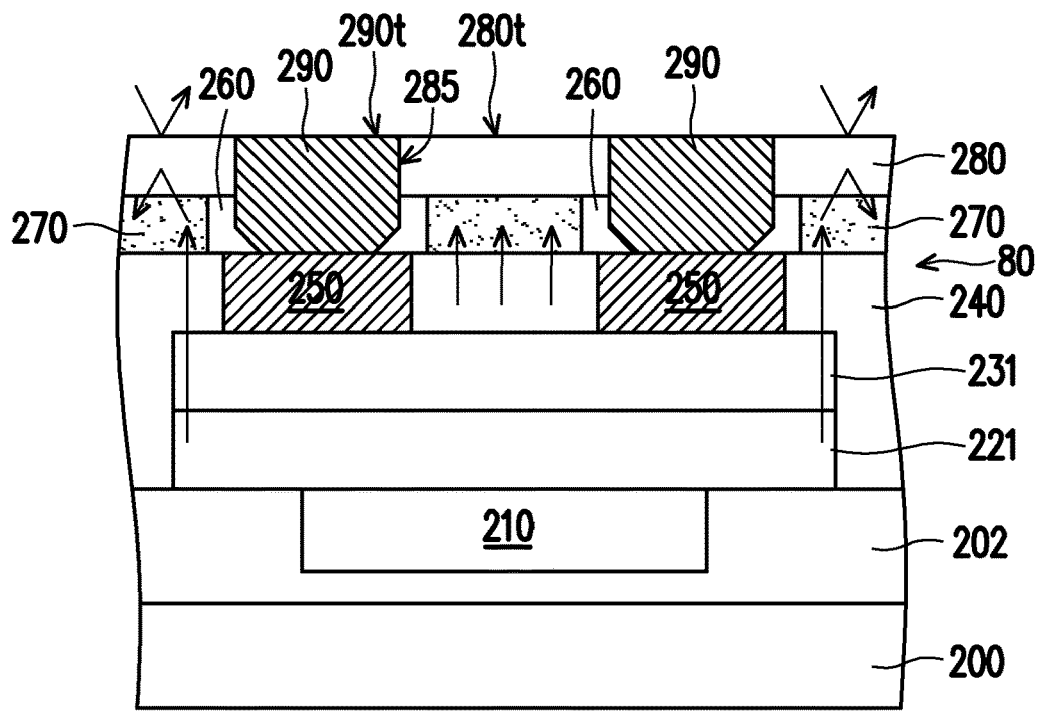
Figure 13:
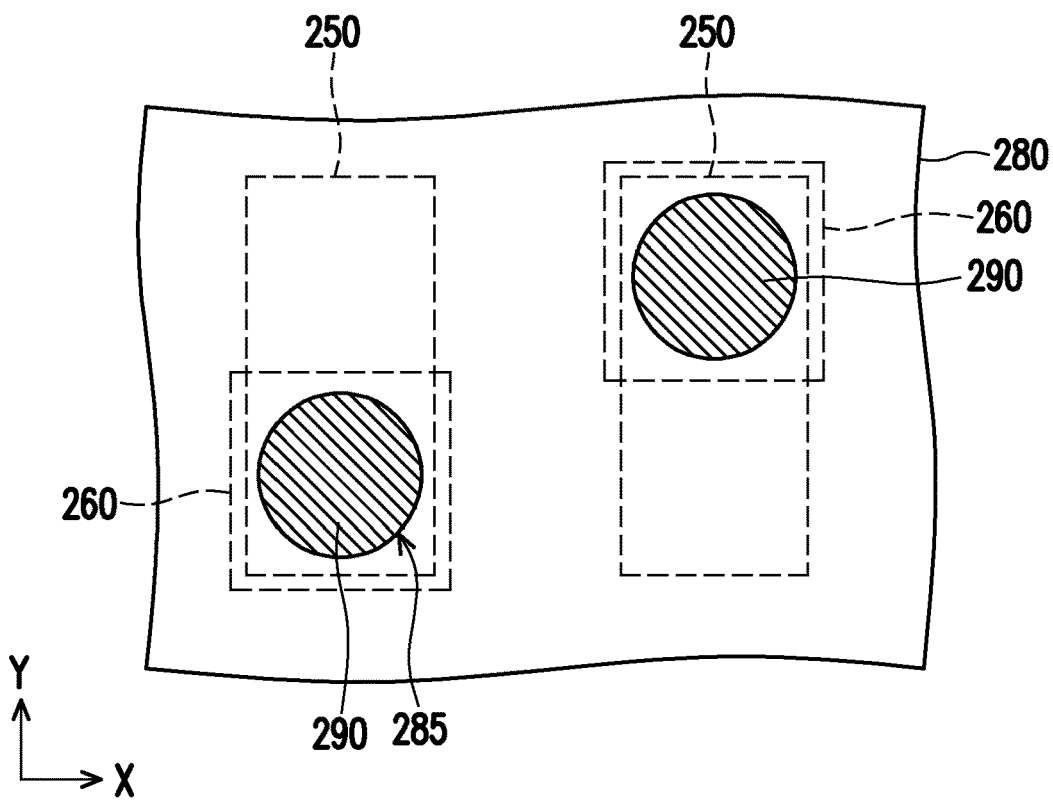

FIG. 2 through FIG. 13 are schematic cross-sectional views and top views of various stages in a manufacturing method of a semiconductor device in accordance with some embodiments of the disclosure. From FIG. 2 through FIG. 13, schematic cross-section views of a device region of the integration structure are shown. FIG. 9, FIG. 11 and FIG. 13 are exemplary top views of the structure shown in FIG. 8, FIG. 10 and FIG. 12 respectively.

Figure 2:
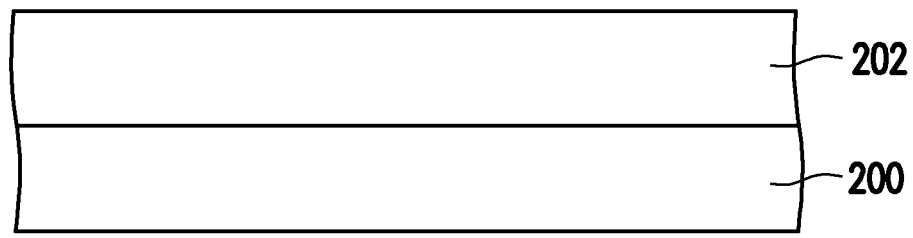
FIG. 2 to FIG. 13 are schematic cross-sectional views and top views of various stages in a manufacturing method of a semiconductor device in accordance with some embodiments of the disclosure.

Referring to FIG. 2, in some embodiments, a substrate 200 is provided and the substrate 200 is substantially similar to the frontend tier as described in reference to FIG. 1 and includes the semiconductor devices as described in the previous embodiment(s). In some embodiments, in addition to the FEOL semiconductor devices as described above, the substrate 200 also includes one or more active component such as transistors, diodes, optoelectronic devices and/or one or more passive components such as capacitors, inductors and resistors. From FIG. 2 to FIG. 13, only a portion of the device region of the structure is shown for illustration purposes.

Referring to FIG. 2, in some embodiments, the substrate 200 includes a semiconductor substrate. In one embodiment, the substrate 200 comprises doped or undoped semiconductor substrate such as a crystalline silicon substrate or a semiconductor substrate made of elemental semiconductor such as diamond or germanium, a compound semiconductor such as gallium arsenide, silicon carbide, indium arsenide, or indium phosphide or an alloy semiconductor such as silicon germanium carbide, gallium arsenic phosphide, or gallium indium phosphide.

In some embodiments, as shown in FIG. 2, an insulation layer 202 is formed on the substrate 200. In some embodiments, the insulation layer 202 includes one or more dielectric layers. In some embodiments, the material of the insulation layer 202 includes silicon oxide, silicon oxycarbide, silicon carbide, silicon oxynitride, silicon nitride, or combinations thereof. In some embodiments, the material of the insulation layer 202 includes a spin-on dielectric material or a low-k dielectric material or a combination thereof. Examples of the spin-on dielectric material and low-k dielectric materials include silicate glass such as FSG, BSG, PSG and BPSG, BLACK DIAMOND®, SILK®, FLARE®, hydrogen silsesquioxane (HSQ), fluorinated silicon oxide (SiOF), amorphous fluorinated carbon, parylene, BCB (bis-benzocyclobutenes), or combinations thereof. The formation of the insulation layer 202 includes performing one or more processes by CVD or by spin-on, for example.

Figure 3:
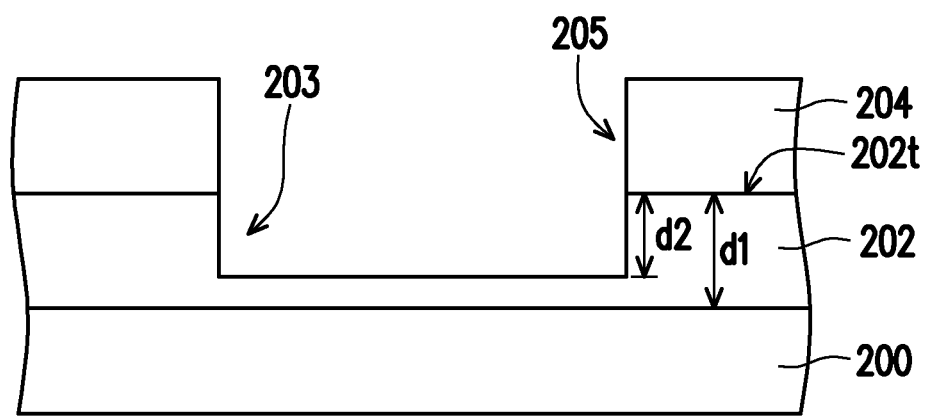

Referring to FIG. 3, a masking layer 204 with a trench opening 205 is formed over a top surface 202t of the insulation layer 202. Later, using the masking layer 204 as a mask, a patterning process is performed to the insulation layer 202, and a portion of the insulation layer 202 that is exposed through the trench opening 205 is removed to form a trench 203 in the insulation layer 202. In some embodiments, the patterning process includes performing a photolithographic process and an anisotropic etching process. In some embodiments, measuring from the top surface 202t of the insulation layer 202, the trench 203 has a depth d2 smaller than a thickness d1 of the insulation layer 202, and the time-control technique is used in the etching process to tune the depth of the formed trench 203 so that the trench 203 does not penetrate through the insulation layer 202 and the substrate 200 is not exposed. In some embodiments, the depth d2 of the trench 203 ranges from about 5 nm to about 1000 nm. The sidewalls of the trench 203 in FIG. 3 may be shown to be vertically sidewalls, but it is understood that the trench may be formed with slant sidewalls or other configurations depending on product designs. Later, the masking layer 204 is removed. In some embodiments, the masking layer 204 may include a photoresist pattern (not shown), and then the photoresist pattern is removed thorough a stripping process or an ashing process.

Figure 4:
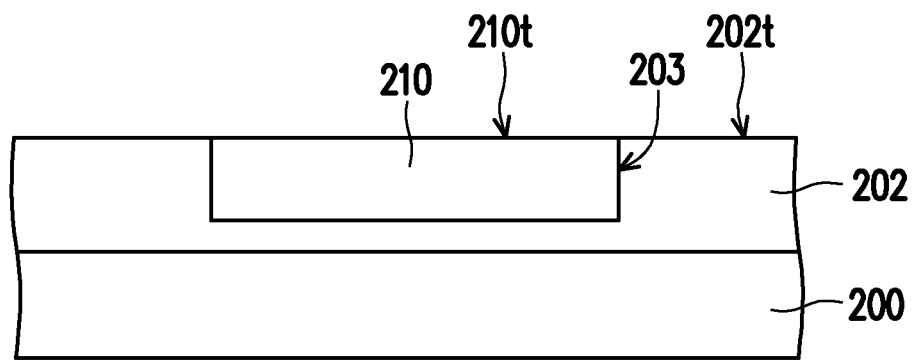

Referring to FIG. 4, after the removal of the masking layer 204, a gate structure 210 is formed in the trench 203. In some embodiments, the formation of the gate structure 210 includes forming a gate material (not shown) over the trench 203 and the insulation layer 202 and filling up the trench 203, and then performing a polishing process such as chemical mechanical polishing (CMP) to remove the extra metallic gate material outside the trench 203 and above the insulation layer 202. In some embodiments, after the polishing process, the top surface 210t of the gate structure 210 and the top surface 202t of the insulation layer 202 are flush. In some embodiments, the gate structure 210 filled in the trench 203 has a thickness ranges from about 5 nm to about 1000 nm, which is substantially equivalent to the depth d2 of the trench 203. In some embodiments, the gate material is blanketly formed over the substrate 200 and the insulation layer 202 filling up the trench 203 and then an etching back process is performed to remove the extra gate material outside the trench 203 and above the insulation layer 202. In some embodiments, after the etching back process, the top surface 210t of the gate structure 210 may be slightly lower than the top surface 202t of the insulation layer 202. In some embodiments, the gate structure 210 includes more than one layers of different metallic materials. In some embodiments, the formation of the gate material includes performing one or more deposition processes selected from CVD (such as, plasma enhanced CVD (PECVD) and laser-assisted CVD), atomic layer deposition (ALD), and PVD (such as sputtering). In some embodiments, the formation of the gate material includes performing a plating process. In some embodiments, the materials of the gate material include Al, Cu, Ti, W, Ta, ruthenium (Ru), nitride thereof, alloys thereof, and/or combinations thereof. For example, the gate structure 210 may include one or more stacked layers of W, Ru, TiN, TaN, TiAl or Al.

Figure 5:
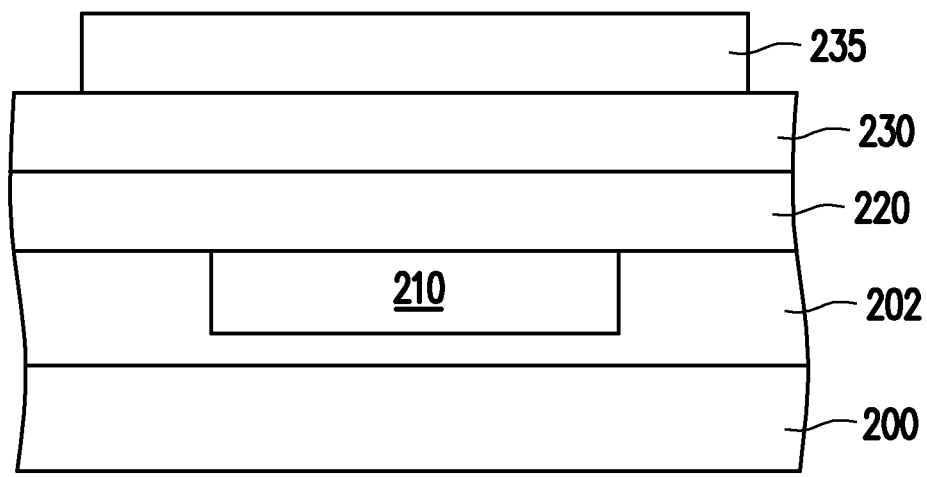

In some embodiments, as seen in FIG. 5, a gate dielectric material layer 220 is globally formed over the insulation layer 202 and the gate structure 210. In some embodiments, the gate dielectric material layer 220 includes one or more high-k dielectric materials, such as zirconium oxide (e.g. $ZrO_2$), gadolinium oxide (e.g. $Gd_2O_3$), hafnium oxide (e.g. $HfO_2$), $BaTiO_3$, aluminum oxide (e.g. $Al_2O_3$), lanthanum oxide (e.g. $LaO_2$), titanium oxide (e.g. $TiO_2$), tantalum oxide (e.g. $Ta_2O_5$), yttrium oxide (e.g. $Y_2O_3$), BaZrO, HfZrO, HfLaO, HfTaO, HfTiO, or combinations thereof. In some embodiments, the gate dielectric material layer 220 includes silicon oxide. In some embodiments, the gate dielectric material layer 220 includes one or more materials selected from aluminum oxide, hafnium oxide, tantalum oxide and zirconium oxide. In some embodiments, the formation of the gate dielectric material layer 220 includes one or more deposition processes selected from CVD (such as, PECVD), ALD and PVD (such as, sputtering). In some embodiments, the gate dielectric material layer 220 is formed with a thickness ranging from about 1 nm to about 100 nm. In some embodiments, the materials of the gate dielectric material layer 120 include aluminum oxide, hafnium oxide, silicon oxide, or combinations thereof. For example, the gate dielectric material layer 220 may be formed by depositing a composite layer of hafnium oxide and aluminum oxide (e.g. $HfO_2/Al_2O_3$) through ALD.

In some embodiments, referring to FIG. 5, after forming the gate dielectric material layer 220, a semiconductor material layer 230 is formed over the gate dielectric material layer 220. In some embodiments, the material of the semiconductor material layer 230 includes a conducting oxide semiconductor material or an amorphous oxide semiconductor material. In some embodiments, the formation of the semiconductor material layer 230 includes one or more deposition processes selected from CVD (such as, PECVD and laser-assisted CVD), ALD, and PVD (such as, sputtering, pulse laser deposition (PLD) and e-beam evaporation). Optionally, when the formation of the semiconductor material layer 230 includes a CVD process or ALD process, an annealing process may be included. In some embodiments, the semiconductor material layer 230 is formed with a thickness ranging from about 1 nm to about 100 nm. In some embodiments, the semiconductor material layer 230 includes indium oxide (InO), indium tin oxide (ITO), indium tungsten oxide (IWO), indium zinc oxide (IZO), indium gallium zinc oxide (IGZO) or zinc tin oxide (ZTO) or combinations thereof. In some embodiments, the material of the semiconductor material layer 230 includes indium oxide (InO), indium tin oxide (ITO), indium tungsten oxide (IWO) or combinations thereof. In some embodiments, the semiconductor material layer 230 includes one or more amorphous semiconductor materials. In some embodiments, the semiconductor material layer 230 is deposited through performing an ALD process.

Figure 6:
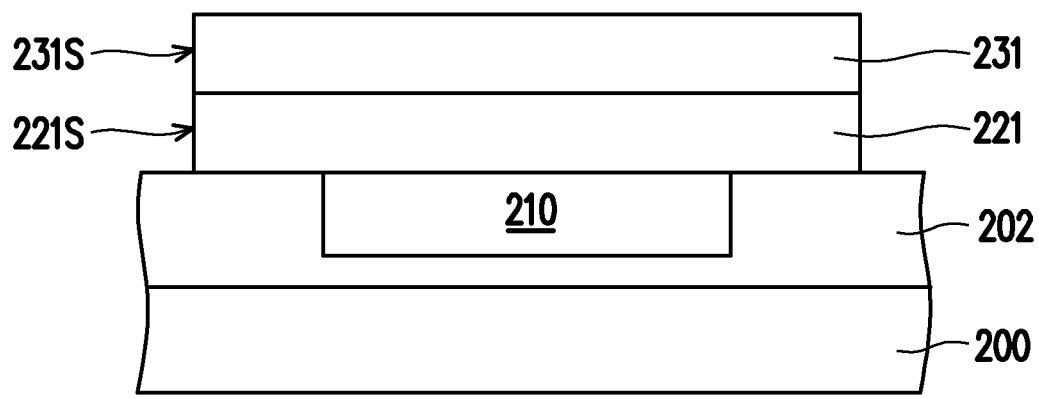

Referring to FIG. 5 and FIG. 6, a photoresist pattern 235 is formed on the semiconductor material layer 230 exposing a portion of the semiconductor material layer 230. Later, using the photoresist pattern 235 as a mask, a patterning process is performed to transfer the pattern of the photoresist pattern 235 to the underlying semiconductor material layer 230 and the below gate dielectric material layer 220 to respectively form a semiconductor layer 231 and a gate dielectric layer 221 on the insulation layer 202 and the gate structure 210. In some embodiments, the gate dielectric layer 221 is sandwiched between the gate structure 210 and the semiconductor layer 231, and the semiconductor layer 231 functions as the channel layer of the device.

Referring to FIG. 5 and FIG. 6, in some embodiments, the semiconductor material layer 230 and the below gate dielectric material layer 220 are patterned into the semiconductor layer 231 and the gate dielectric layer 221 on the gate structure 210 and on the insulation layer 202 exposing a portion of the insulation layer 202. In some embodiments, the semiconductor material layer 230 and the below gate dielectric material layer 220 are patterned in one continuous patterning process. In some embodiments, the semiconductor material layer 230 and the below gate dielectric material layer 220 are sequentially patterned through multiple patterning processes. As shown in FIG. 6, in exemplary embodiments, the sidewalls 231S of the semiconductor layer 231 and the sidewalls 221S of the gate dielectric layer 221 may be shown to be vertically aligned or coplanar, and both layers may be shown to be patterned into substantially the same pattern design or configuration. However, it is understood that either of the semiconductor layer 231 and the gate dielectric layer 221 may have different patterns or configurations depending on product designs. Herein, as the patterning process may utilize similar patterning process(es) as described above, the details of the patterning process will not be repeated again.

Referring to FIG. 7, a capping dielectric layer 240 is blanketly formed over the semiconductor layer 231 and the gate dielectric layer 221 and over the exposed insulation layer 202. In some embodiments, the capping dielectric layer 240 is thick enough to fully cover the semiconductor layer 231 and the gate dielectric layer 221 (i.e. covering the sidewalls 231S, 221S of the semiconductor layer 231 and the gate dielectric layer 221 and the top surface 231t of the semiconductor layer 231) and the exposed insulation layer 202. In some embodiments, the capping dielectric layer 240 is formed with a thickness ranging from about 5 nm to about 1000 nm. In some embodiments, the capping dielectric layer 240 includes silicon oxide (SiOx), silicon oxycarbide (SiOC), silicon carbonitride (SiCN), silicon oxynitride (SiON) or combinations thereof. In some embodiments, the capping dielectric layer 240 includes one or more low-k dielectric materials. Examples of low-k dielectric materials include silicate glass such as phospho-silicate-glass (PSG) and boro-phospho-silicate-glass (BPSG), BLACK DIAMOND®, SILK®, hydrogen silsesquioxane (HSQ), fluorinated silicon oxide (SiOF), amorphous fluorinated carbon, parylene, BCB (bis-benzocyclobutene), flare, or a combination thereof. In some embodiments, the formation of the capping dielectric layer 240 includes one or more processes selected from CVD (such as, PECVD), ALD and PVD (such as, sputtering).

Thereafter, referring to FIG. 8 and FIG. 9, separate openings 245 are formed in the capping dielectric layer 240 exposing portions of the underlying semiconductor layer 231 and terminals 250 are formed in the openings 245 filling up the openings 245. In some embodiments, the terminals 250 are in direct contact with the semiconductor layer 231. In some embodiments, referring to the example layout shown in FIG. 9, at least two terminals 250 are formed in the two openings 245 near opposing sides of the semiconductor layer 231. In some embodiments, the terminals 250 function as the source and drain terminals of the device, and the semiconductor layer 231 includes a channel region 233 located between the two terminals 250. From the top view of FIG. 9, the spans of the two terminals 250 vertically overlap with the span of the underlying gate structure 210 respectively at two opposing sides of the gate structure 210. In some embodiments, the individual terminals 250 have the same sizes and substantially the same shape. However, it is possible that the source or drain terminal may have different sizes or shapes. The formation of the openings involves similar process steps or methods used in the patterning process such as photolithographic technologies and etching process and details are not repeated herein. The formation of the terminals 250 includes forming a seed layer (not shown) and/or a barrier layer (not shown) conformally over the openings 245, forming a metallic material (not shown) to fill up the openings 245 and then performing a polishing process such as a CMP process to remove the extra materials outside the openings 245. In some embodiments, the formation of the metallic material includes performing one or more deposition processes selected from CVD (such as, PECVD), ALD, and PVD (such as sputtering). In some embodiments, the formation of the metallic material includes performing a plating process (such as electrochemical plating (ECP)). In some embodiments, the materials of the metallic material include Al, Cu, Ti, W, Ta, Ru, nitride thereof, alloys thereof, and/or combinations thereof. For example, the terminals 250 may include one or more stacked layers of W, Ru, TiN, TaN, TiAl or Al. In some embodiments, the barrier material includes titanium nitride (TiN) formed by the metal organic CVD (MOCVD) process, the seed material includes tungsten formed by CVD, and the metallic material includes tungsten formed by the CVD process (especially tungsten CVD processes). For example, the terminals 250 include tungsten terminals with titanium nitride barrier. As seen in FIG. 8, the terminals 250 fill up the openings 245 and the top surfaces 250t of the terminals 250 are substantially flush with and levelled with the top surface 240t of the capping dielectric layer 240.

In FIG. 8, a transistor structure 80 is obtained, and the transistor structure 80 includes the bottom gate structure 210, a stack of the gate dielectric layer 221 and the semiconductor layer 231 located on the gate structure 210, and the source and drain terminal 250 located on the semiconductor layer 231. In some embodiments, the transistor structure 80 is a bottom-gated transistor structure or a back-gate transistor structure. In some embodiments, the transistor structure 80 includes an oxide semiconductor thin film transistor.

Referring to FIG. 10 and FIG. 11, after the formation of the terminals 250, a gas absorbing layer 270 is formed and insulating dielectric patterns 260 are formed over the capping dielectric layer 240 and covering the capping dielectric layer 240 and terminals 250. In some embodiments, the gas absorbing layer 270 is formed with openings 265 exposing the terminals 250 and the insulating dielectric patterns 260 are filled in the openings 265. For example, the formation of the gas absorbing layer 270 includes PVD (such as, sputtering, PLD and e-beam evaporation) or ALD, and the openings 265 may be formed through any applicable method such as photolithographic technologies and etching process. In some embodiments, the gas absorbing layer 270 includes a hydrogen absorbing material layer to assist the absorption of hydrogen or water vapor from the surroundings. In some embodiments, the hydrogen absorbing material includes Laves phases intermetallic compounds, which may be denoted as $AB_2$ whereas A is Mg, Zr, or Ti, and B is Ni, Mn, Cr, or V. In some embodiments, the hydrogen absorbing material includes TiCr, MgNi or alloys thereof. In some embodiments, the hydrogen absorbing material includes TiFe intermetallic compounds, $LaNi_5$-based hydride materials, Mg-based hydride materials or combinations thereof. In one embodiment, the formation of the gas absorbing layer 270 includes sputtering at least one layer of TiCr and/or MgNi over the capping dielectric layer 240 and terminals 250. In some embodiments, the gas absorbing layer 270 functions as a hydrogen absorbing layer with a hydrogen absorbing amount of about 0.1-10 percentage by weight (wt. %) based on the total weight of the gas absorbing layer 270. In some embodiments, the hydrogen absorbing material layer is blanketly formed over the top surfaces of the capping dielectric layer 240 and the terminals 250 with a thickness ranging from about 50 nm to about 500 nm. Later, the openings 265 are formed in the gas absorbing layer 270 that expose portions of the terminals 250 and then the insulating dielectric patterns 260 are formed within the openings 265 filling up the openings 265. In some embodiments, the locations of the insulating dielectric patterns 260 respectively correspond to the locations of the underlying corresponding terminals 250.

Referring to FIG. 10 and FIG. 11, in some embodiments, the insulating dielectric patterns 260 filled in the openings 265 are shown to be two separate tetragonal shaped patterns located above the terminals 250 and respectively at end portions of the terminals 250. In some embodiments, the gas absorbing layer 270 fully covers the underlying structure and surrounds the insulating dielectric patterns 260. In some embodiments, the two insulating dielectric patterns 260 respectively cover two different and opposing ends of the two terminals 250 as seen in FIG. 11. From the top view of FIG. 11, the span of each insulating dielectric pattern 260 covers and vertically overlaps with one end portion of the rectangular shaped terminal 250. In some alternative embodiments, the locations of the insulating dielectric patterns may be adjusted to cover either the end or middle portion of the terminal(s) and may cover the terminal ends at the same side or different sides depending on the layout design of the contacts and the wiring lines of the products. As seen in FIG. 10, in one embodiment, the insulating dielectric pattern 260 has a width W2 larger than a width W1 of the underlying terminal 250; however, from the top view of FIG. 11, compared with the below corresponding terminal 250, it is seen that although the insulating dielectric pattern 260 is wider in the X-direction but the length (in the Y-direction) of the insulating dielectric pattern 260 is shorter so that the insulating dielectric pattern 260 only covers a portion of the terminal 250. It is understood that the dimensions or shapes of the insulating dielectric pattern 260 may be adjusted to partially overlap with or fully overlap with the span of the terminal(s) 250. In some embodiments, the insulating dielectric patterns 260 may be formed with different shapes or sizes.

In some embodiments, the insulating dielectric patterns 260 include silicon oxide (SiOx), SiOC, SiCN, SiON or combinations thereof. In some embodiments, the insulating dielectric patterns 260 include one or more low-k dielectric materials as described above. For example, the formation of the insulating dielectric patterns 260 includes a CVD process or ALD process or a PVD process. In some embodiments, a planarization process or a polishing process such as a CMP process may be performed, and the insulating dielectric patterns 260 filled up the openings 265 and the top surfaces 260t are substantially flush with and levelled with the top surface 270t of the gas absorbing layer 270.

Referring to FIG. 12 and FIG. 13, after forming the gas absorbing layer 270 and the insulating dielectric patterns 260, a gas barrier layer 280 is formed over the gas absorbing layer 270 and the insulating dielectric patterns 260. In some embodiments, the gas barrier layer 280 is blanketly formed over the gas absorbing layer 270 and the insulating dielectric patterns 260. Later, openings 285 are formed in the gas barrier layer 280 penetrating through the gas barrier layer 280 and the insulating dielectric patterns 260 to expose the terminals 250, and then contact plugs 290 are filled in the openings 285 to form a device structure 12. In some embodiments, the contact plugs 290 fill up the openings 285, and the locations of the contact plugs 290 respectively correspond to the locations of the insulating dielectric patterns 260 and correspond to the locations of the underlying corresponding terminals 250. In some embodiments, the gas barrier layer 280 includes a hydrogen impermeable material layer to prevent the diffusion or permeability of hydrogen or water vapor from the outside into the stacked structure. Also, the hydrogen impermeable material layer may assist the confinement of hydrogen or water vapor from the surroundings. In some embodiments, the hydrogen impermeable material layer includes silicon nitride. In some embodiments, the hydrogen impermeable material layer includes aluminum oxide, or titanium oxide, or a combination thereof. For example, the formation of the gas barrier layer 280 includes performing CVD, ALD, or PVD, and the openings 285 may be formed through any applicable method such as photolithographic technologies and etching process. In some embodiments, the gas barrier layer 280 is formed with a thickness ranging from about 50 nm to about 500 nm. For example, the gas barrier layer 280 may be formed by depositing a composite layer of titanium oxide and aluminum oxide (e.g. $TiO_2/Al_2O_3$) through ALD.

Thereafter, referring to FIG. 12 and FIG. 13, separate contact openings 285 are formed extending from the top surface 280t of the gas barrier layer 280 through the gas barrier layer 280 and the insulating dielectric patterns 260 to expose the top surfaces of the terminals 250, and contact plugs 290 fill up the openings 285. In some embodiments, the contact plugs 290 are in direct contact with the terminals 250 above the semiconductor layer 231. In some embodiments, referring to the example layout shown in FIG. 13, at least two contact plugs 290 are formed in the two openings 285, and the two contact plugs 290 are respectively located within the spans of the insulating dielectric patterns 260 and located right above the end portions of the terminals 250. From FIG. 12 and the exemplary top view of FIG. 13, the gas barrier layer 280 surrounds the contact plugs 290, the insulating dielectric patterns 260 respectively surround the contact plugs 290 and physically isolate the contact plugs 290 from the gas absorbing layer 270. In some embodiments, the terminals 250 function as the source and drain terminals of the device, and the contact plugs 290 functions as the source contact and drain contacts. From the top view of FIG. 13, the vertical projections (spans) of the two contact plugs 290 fall completely within the spans of the insulating dielectric patterns 260 and fall within the spans of the terminals 250. In some embodiments, the individual contact plugs 290 have the same sizes and substantially the same shape. However, it is possible that the number, shape, size or the arrangement of the contact plugs are modified depending on the electrical requirements of the products.

As described above, the formation of the openings 285 involves similar process steps or methods used in the patterning process such as photolithographic technologies and etching process and details are not repeated herein. The formation of the contact plugs 290 includes forming a seed layer (not shown) and/or a barrier layer (not shown) conformally over the openings 285, forming a metallic material (not shown) to fill up the openings 285 and then performing a polishing process such as a CMP process to remove the extra materials outside the openings 285. As seen in FIG. 12, in some embodiments, the top surfaces 290t of the contact plugs 290 are substantially flush with and levelled with the top surface 280t of the gas barrier layer 280. In some embodiments, the formation of the metallic material includes performing one or more deposition processes selected from CVD (such as, PECVD), ALD, and PVD (such as sputtering). In some embodiments, the formation of the metallic material includes performing a plating process (such as electrochemical plating (ECP)). In some embodiments, the materials of the metallic material include Al, Cu, Ti, W, Co, Ta, Ru, nitride thereof, alloys thereof, and/or combinations thereof. For example, the contact plugs 290 may include W, Cu, Co, TiN, TaN, TiAl or Al. For example, the contact plugs 290 include tungsten terminals with titanium nitride barrier.

Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

In some embodiments, as seen in FIG. 12, the diffusion of the gas or water vapor (represented by the arrows in FIG. 12) from the underlying layers or structure may be absorbed by the gas absorbing layer 270. In addition to the hydrogen gas or water vapor captured by the gas absorbing layer 270, any vapor or gas (e.g. hydrogen) escaped may be blocked by the gas barrier layer 280 and confined within the gas absorbing layer 270. In some embodiments, the gas barrier layer 280 may also resist the entry of the hydrogen gas or water vapor from the surroundings.

In the above embodiments, the processes for forming the transistor structure 80 or the device structure 12 are compatible with the BEOL processes and are similar to the process for forming the semiconductor devices 120, 130 in the backend tier BT as described in reference to FIG. 1, and the transistor structure 80 or the device structure 12 may be included and provided as the semiconductor devices or as part of the semiconductor devices as described reference to FIG. 1. According to the embodiments, the device structures are formed with the gas absorbing layer and the gas barrier layer so that better reliability and improved electrical performance are achieved.

Figure 14:
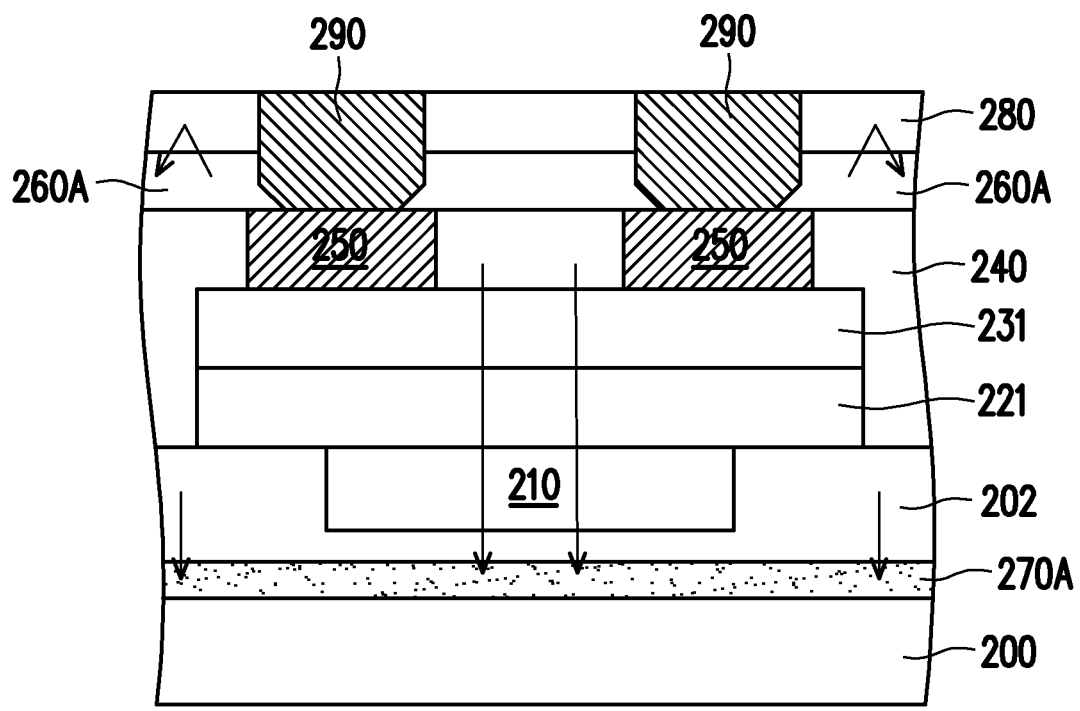
FIG. 14, FIG. 15 and FIG. 16 are schematic cross-sectional views showing various semiconductor device structures in accordance with some embodiments of the present disclosure.
Figure 15:
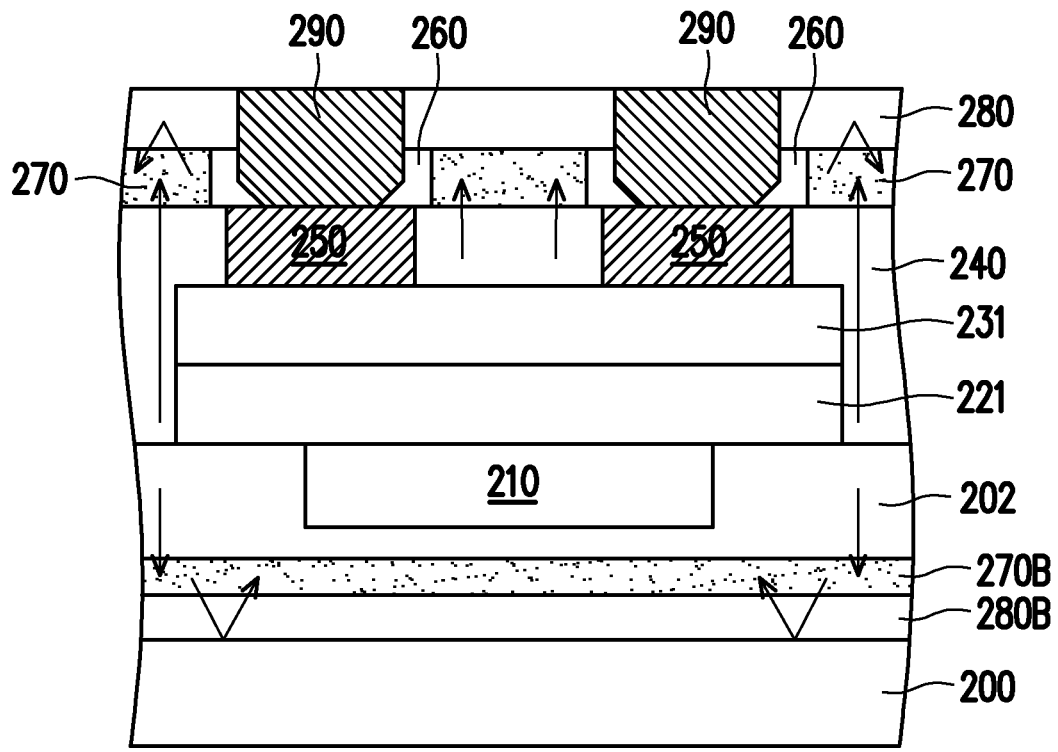
Figure 16:
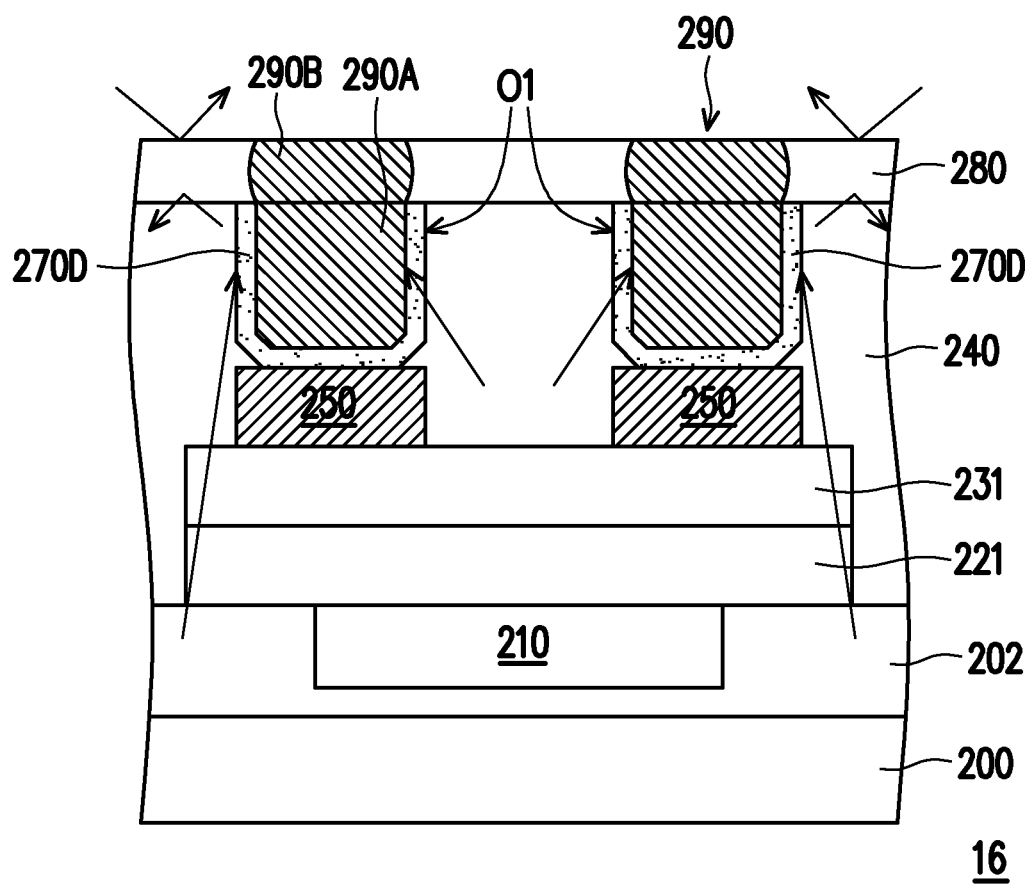

FIG. 14, FIG. 15 and FIG. 16 are schematic cross-sectional views showing various semiconductor device structures in accordance with some embodiments of the present disclosure.

In some embodiments, the following device structures may be described in a way to skip certain details to describe the different structural configurations but it is understood that additional parts, elements or passive components, such as resistors, capacitors, inductors, and/or fuses may be included or integrated therein. In some embodiments, additional steps may be provided before, during, and after the process steps depicted from FIG. 1 to FIG. 13, and some of the steps described above may be replaced or eliminated for additional embodiments.

In the illustrated embodiments, the described methods and structures may be formed compatible with the current semiconductor manufacturing processes. In exemplary embodiments, the described methods and structures are formed during back-end-of-line (BEOL) processes.

In some embodiments, referring to FIG. 14, another device structure 14 is described. The device structure 14 may be formed through similar processes using similar or substantially the same materials as described in the previous embodiment(s), and the configurations of the device structure 14 are similar to the configurations of the device structure 12 shown in FIG. 12 except for that the gas absorbing layer 270A is located between the substrate 200 and the insulation layer 202. In some embodiments, the device structure 14 in FIG. 14 includes an insulating dielectric layer 260A fully covering the capping dielectric layer 240 and the terminals 250. In some embodiments, as seen in FIG. 14, the diffusion of the gas or water vapor (represented by the arrows in FIG. 14) from the underlying layers or structure may be blocked by the gas barrier layer 280, while the diffusion of hydrogen or vapor from the above layers or structure may be absorbed by the under gas absorbing layer 270A and the hydrogen gas or water vapor may be captured by the gas absorbing layer 270A. In some embodiments, the gas barrier layer 280 may also resist the entry of the hydrogen gas or water vapor from the surroundings.

In some embodiments, referring to FIG. 15, a device structure 15 is described. The device structure 15 may be formed through similar processes using similar or substantially the same materials as described in the previous embodiment(s), and the configurations of the device structure 15 are similar to the configurations of the device structure 12 shown in FIG. 12 except for that another additional gas absorbing layer 270B and another additional gas barrier layer 280B are located between the substrate 200 and the insulation layer 202. In some embodiments, for the device structure 15 in FIG. 15, the diffusion of the gas or water vapor (represented by the arrows in FIG. 15) from the middle layers or structure may be absorbed by the upper gas absorbing layer 270 and the lower gas absorbing layer 270B. In addition to the hydrogen gas or water vapor captured by the gas absorbing layers 270 and 270B, any vapor or gas (e.g. hydrogen) escaped may be blocked by the upper gas barrier layer 280 and lower gas barrier layer 280B. In some embodiments, the gas barrier layer 280 may also resist the entry of the hydrogen gas or water vapor from the environments.

In some embodiments, referring to FIG. 16, another device structure 16 is described. The device structure 16 may be formed through similar processes using similar or substantially the same materials as described in the previous embodiment(s), and the configurations of the device structure 16 are similar to the configurations of the device structure 12 shown in FIG. 12. For the device structure 16, the source and drain terminals and portions of the contact plugs are formed in the capping dielectric layer 240. It is understood that the capping dielectric layer may include multiple dielectric layers or sublayers even it is illustrated as a single layer in the figures. Referring to FIG. 16, after forming the terminals 250, contact openings O1 are formed in the capping dielectric layer 240 and gas absorbing layers 270D are formed within the contact openings O1. In some embodiments, the gas absorbing layers 270D are conformal to the profiles of the contact openings O1 and do not fill up the openings O1. In some embodiments, the contacts are formed in two stages, the contact plugs 290A are filled inside the gas absorbing layers 270D and are surrounded by the gas absorbing layers 270D. Later, the gas barrier layer 280 is blanketly formed, and following the formation of the openings in the gas barrier layer 280, contact plugs 290B are formed directly on and connected to the contact plugs 290A. In general, the contact plugs 290A and 290B are aligned and connected and considered as whole contact plugs 290. As seen in FIG. 16, the gas absorbing layers 270D are sandwiched between the capping dielectric layer 240 and the contact plugs 290A and between the terminals 250 and the contact plugs 290A. In some embodiments, as seen in FIG. 16, the diffusion of the gas or water vapor (represented by the arrows in FIG. 16) from the underlying layers or structure may be absorbed and captured by the gas absorbing layers 270D surrounding the contact plugs 290A, and the hydrogen gas or water vapor may be blocked by the gas barrier layer 280. In some embodiments, the gas barrier layer 280 may also resist the entry of the hydrogen gas or water vapor from the environments.

According to the exemplary embodiments, the device structures are formed with the gas absorbing layer and/or the gas barrier layer so that the reliability of the semiconductor device is improved and the performance of the semiconductor device is boosted.

In the exemplary embodiments, the formation of the gas barrier layer and the gas absorbing layer helps to confine the gas or water vapor and prevent the downgrade of the channel layer, which reduces the positive-bias-stress-induced threshold voltage shift and improves the transistor properties. Overall, the electrical performance of the semiconductor device is enhanced.

In some embodiments of the present disclosure, a semiconductor device is described. The semiconductor device includes a gate, a semiconductor channel layer, a gate dielectric layer, a source terminal and a drain terminal. The semiconductor channel layer is disposed over and above the gate. The gate dielectric layer is disposed between the gate and the semiconductor channel layer. The source terminal and the drain terminal are disposed on the semiconductor channel layer. A contact plug is disposed on at least one of the source terminal and the drain terminal. A dielectric pattern surrounds the contact plug and covers the source terminal and the drain terminal. A gas barrier layer is disposed on the dielectric pattern and surrounding the contact plug.

In some embodiments of the present disclosure, a semiconductor device is described. The semiconductor device includes a semiconductor material layer, a gate layer, a gate dielectric layer, a source and a drain. The gate layer is disposed below the semiconductor material layer, and the gate dielectric layer is disposed between the gate layer and the semiconductor material layer. The source and the drain are disposed on the semiconductor material layer. Contacts are disposed on the source and drain. A gas absorbing layer is disposed over the source, the drain and the semiconductor material layer and surrounds the contacts. A gas barrier layer is disposed on the gas absorbing layer and surrounds the contacts.

In some embodiments of the present disclosure, a method for forming a semiconductor device is described. A gate structure is formed in an insulation layer. A gate dielectric layer and a semiconductor layer are formed over the gate structure. A dielectric layer is formed over the semiconductor layer, the gate dielectric layer and the gate structure. First openings are formed in the dielectric layer exposing portions of the semiconductor layer. Source and drain terminals are formed in the first openings and on the semiconductor layer. A gas barrier layer is formed over the dielectric layer and the source and drain terminals. Contacts are formed on the source and drain terminals, and the contacts penetrate through the gas barrier layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a gate;
   a semiconductor channel layer disposed over and above the gate;
   a gate dielectric layer disposed between the gate and the semiconductor channel layer;
   a source terminal and a drain terminal disposed on the semiconductor channel layer;
   a contact plug disposed on at least one of the source terminal and the drain terminal;
   a dielectric pattern, surrounding the contact plug and covering the source terminal and the drain terminal;
   a gas absorbing layer, disposed between the contact plug, the dielectric pattern and the source and drain terminals, surrounding and wrapping around the contact plug, wherein the gas absorbing layer includes a first hydrogen absorbing material layer containing TiCr, MgNi or alloys thereof; and a gas impermeable barrier layer, disposed on the dielectric pattern and surrounding the contact plug.

2. The semiconductor device of claim 1, wherein the gas impermeable barrier layer includes a hydrogen impermeable material layer, and the hydrogen impermeable material layer includes aluminum oxide, titanium oxide, or a combination thereof.

3. The semiconductor device of claim 1, further comprising a capping dielectric layer over the gate and covering the semiconductor channel layer and the source and drain terminals.

4. The semiconductor device of claim 3, wherein the capping dielectric layer includes a low-k dielectric layer.

5. The semiconductor device of claim 1, further comprising another gas absorbing layer disposed below the gate.

6. The semiconductor device of claim 5, further comprising another gas impermeable barrier layer disposed below the another gas absorbing layer.

7. The semiconductor device of claim 6, wherein the gas impermeable barrier layer includes a first hydrogen impermeable material layer containing aluminum oxide, titanium oxide, or a combination thereof, and the another gas impermeable barrier layer includes a second hydrogen impermeable material layer containing aluminum oxide, titanium oxide, or a combination thereof.

8. The semiconductor device of claim 7, wherein the another gas absorbing layer includes a second hydrogen absorbing material layer, and the second hydrogen absorbing material layer includes TiCr, MgNi or alloys thereof.

9. The semiconductor device of claim 1, wherein a material of the semiconductor channel layer includes indium oxide (InO), indium tin oxide (ITO), indium tungsten oxide (IWO), indium zinc oxide (IZO), indium gallium zinc oxide (IGZO) or zinc tin oxide (ZTO) or a combination thereof.

10. A semiconductor device, comprising:
a semiconductor material layer;
a gate layer disposed below the semiconductor material layer;
a gate dielectric layer disposed between the gate layer and the semiconductor material layer;
a source and a drain disposed on the semiconductor material layer;
contacts disposed on the source and drain;
a gas absorbing layer, disposed over the source, the drain and the semiconductor material layer, between the contacts and the source and the drain, and surrounding and wrapping around the contacts, wherein the gas absorbing layer includes a hydrogen absorbing material layer containing TiCr, MgNi or alloys thereof; and
a gas impermeable barrier layer, disposed on the gas absorbing layer and surrounding the contacts.

11. The semiconductor device of claim 10, wherein the gas impermeable barrier layer includes a hydrogen impermeable layer.

12. The semiconductor device of claim 10, further comprising insulating dielectric patterns located on the source and the drain, located between the gas absorbing layer and the contacts and surrounding the contacts.

13. The semiconductor device of claim 12, wherein the contacts are embedded in the gas impermeable barrier layer and the insulating dielectric patterns.

14. The semiconductor device of claim 12, further comprising at least one of another gas absorbing layer and another gas impermeable barrier layer below the gate layer.

15. The semiconductor device of claim 10, wherein the gas absorbing layer wraps around the contacts and are located between the contacts and the source and the drain.

16. A semiconductor device, comprising:
a substrate with an insulation layer thereon;
a semiconductor material layer disposed over the insulation layer and the substrate;
a gate layer disposed below the semiconductor material layer and over the insulation layer;
a gate dielectric layer disposed between the gate layer and the semiconductor material layer;
a source and a drain disposed on the semiconductor material layer;
contacts disposed on the source and drain;
a gas absorbing layer, surrounding and wrapping around the contacts and disposed between the contacts and the source and the drain, wherein the gas absorbing layer includes a hydrogen absorbing material layer containing TiCr, MgNi or alloys thereof; and
a gas impermeable barrier layer, disposed on the gas absorbing layer and surrounding the contacts.

17. The semiconductor device of claim 16, wherein the gas impermeable barrier layer includes a hydrogen impermeable layer.

18. The semiconductor device of claim 16, further comprising an insulating dielectric layer located over the source and the drain, covering the source, the drain, the semiconductor material layer and the gate dielectric layer.

19. The semiconductor device of claim 18, wherein the gas absorbing layer wraps around the contacts and is sandwiched between the insulating dielectric layer and the contacts and between the contacts and the source and the drain to separate the contacts from the source and the drain.

20. The semiconductor device of claim 16, wherein the contacts are embedded in the gas impermeable barrier layer.

* * * * *